(12) United States Patent
Hamaminato et al.

(10) Patent No.: US 8,233,553 B2
(45) Date of Patent: Jul. 31, 2012

(54) DIGITAL BROADCAST DEMODULATOR AND DIGITAL BROADCAST DEMODULATION METHOD FOR SUPPRESSING DEGRADATION OF RECEPTION CHARACTERISTICS

(75) Inventors: Makoto Hamaminato, Kawasaki (JP); Naoto Adachi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 603 days.

(21) Appl. No.: 12/163,441

(22) Filed: Jun. 27, 2008

(65) Prior Publication Data

US 2009/0010370 A1    Jan. 8, 2009

(30) Foreign Application Priority Data

Jun. 27, 2007 (JP) .................. 2007-169366

(51) Int. Cl.
  *H04L 7/02* (2006.01)
(52) U.S. Cl. ........ 375/260; 375/259; 375/316; 375/357; 375/373
(58) Field of Classification Search .................. 375/260, 375/350, 373; 725/152; 348/726
See application file for complete search history.

(56) References Cited

U.S. PATENT DOCUMENTS

| 5,796,777 A | 8/1998 | Terlep et al. |
| 7,098,967 B2 * | 8/2006 | Kanno et al. .................. 348/726 |
| 2002/0137465 A1 | 9/2002 | Nakano |
| 2005/0229235 A1 * | 10/2005 | Loyer .......................... 725/152 |

FOREIGN PATENT DOCUMENTS

| JP | 6-014072 A | 1/1994 |
| JP | 10-200427 A | 7/1998 |
| JP | 11-504192 A | 4/1999 |
| JP | 2002-17118 A | 6/2002 |
| JP | 2002-290340 A | 10/2002 |
| JP | 2004-032649 A | 1/2004 |
| JP | 2006-332857 A | 12/2006 |

* cited by examiner

*Primary Examiner* — Shuwang Liu
*Assistant Examiner* — Ross Varndell
(74) *Attorney, Agent, or Firm* — Arent Fox LLP

(57) ABSTRACT

A digital broadcast demodulator receives a tuner signal output from a tuner and carries out demodulation processing on the tuner signal by using an internal clock signal that is synchronized with a reference signal. The digital broadcast demodulator has an internal clock-signal generator and an internal clock frequency controller. The internal clock-signal generator generates the internal clock signal, and the internal clock frequency controller controls a frequency of the internal clock signal in accordance with a reception channel.

4 Claims, 9 Drawing Sheets

Fig.5

| ch | ONE-SEGMENT BAND FREQUENCY | | | INTERNAL CLOCK SIGNAL 2.08695 | | OUT AT MIN. FREQ. | OUT AT MAX. FREQ. |
|---|---|---|---|---|---|---|---|
| | MIN. FREQ. | CENTER FREQ. | MAX. FREQ. | | | | |
| 13 | 472.929 | 473.143 | 473.357 | 471.6507 | 473.73765 | 0 | 0 |
| 14 | 478.929 | 479.143 | 479.357 | 477.91155 | 479.9985 | 0 | 0 |
| 15 | 484.929 | 485.143 | 485.357 | 484.1724 | 486.25935 | 0 | 0 |
| 16 | 490.929 | 491.143 | 491.357 | 490.43325 | 492.5202 | 0 | 0 |
| 17 | 496.929 | 497.143 | 497.357 | 496.6941 | 498.78105 | 0 | 0 |
| 18 | 502.929 | 503.143 | 503.357 | 502.95495 | 505.0419 | 1 | 0 |
| 19 | 508.929 | 509.143 | 509.357 | 507.12885 | 509.2158 | 0 | 1 |
| 20 | 514.929 | 515.143 | 515.357 | 513.3897 | 515.47665 | 0 | 0 |
| 21 | 520.929 | 521.143 | 521.357 | 519.65055 | 521.7375 | 0 | 0 |
| 22 | 526.929 | 527.143 | 527.357 | 525.9114 | 527.99835 | 0 | 0 |
| 23 | 532.929 | 533.143 | 533.357 | 532.17225 | 534.2592 | 0 | 0 |
| 24 | 538.929 | 539.143 | 539.357 | 538.4331 | 540.52005 | 0 | 0 |
| 25 | 544.929 | 545.143 | 545.357 | 544.69395 | 546.7809 | 0 | 0 |
| 26 | 550.929 | 551.143 | 551.357 | 550.9548 | 553.04175 | 1 | 0 |
| 27 | 556.929 | 557.143 | 557.357 | 555.1287 | 557.21565 | 0 | 1 |
| 28 | 562.929 | 563.143 | 563.357 | 561.38955 | 563.4765 | 0 | 0 |
| 29 | 568.929 | 569.143 | 569.357 | 567.6504 | 569.73735 | 0 | 0 |
| 30 | 574.929 | 575.143 | 575.357 | 573.91125 | 575.9982 | 0 | 0 |
| 31 | 580.929 | 581.143 | 581.357 | 580.1721 | 582.25905 | 0 | 0 |
| 32 | 586.929 | 587.143 | 587.357 | 586.43295 | 588.5199 | 0 | 0 |
| 33 | 592.929 | 593.143 | 593.357 | 592.6938 | 594.78075 | 0 | 0 |
| 34 | 598.929 | 599.143 | 599.357 | 598.95465 | 601.0416 | 1 | 0 |
| 35 | 604.929 | 605.143 | 605.357 | 603.12855 | 605.2155 | 0 | 1 |
| 36 | 610.929 | 611.143 | 611.357 | 609.3894 | 611.47635 | 0 | 0 |
| 37 | 616.929 | 617.143 | 617.357 | 615.65025 | 617.7372 | 0 | 0 |
| 38 | 622.929 | 623.143 | 623.357 | 621.9111 | 623.99805 | 0 | 0 |
| 39 | 628.929 | 629.143 | 629.357 | 628.17195 | 630.2589 | 0 | 0 |
| 40 | 634.929 | 635.143 | 635.357 | 634.4328 | 636.51975 | 0 | 0 |
| 41 | 640.929 | 641.143 | 641.357 | 640.69365 | 642.7806 | 0 | 0 |
| 42 | 646.929 | 647.143 | 647.357 | 646.9545 | 649.04145 | 1 | 0 |
| 43 | 652.929 | 653.143 | 653.357 | 651.1284 | 653.21535 | 0 | 1 |
| 44 | 658.929 | 659.143 | 659.357 | 657.38925 | 659.4762 | 0 | 0 |
| 45 | 664.929 | 665.143 | 665.357 | 663.6501 | 665.73705 | 0 | 0 |
| 46 | 670.929 | 671.143 | 671.357 | 669.91095 | 671.9979 | 0 | 0 |
| 47 | 676.929 | 677.143 | 677.357 | 676.1718 | 678.25875 | 0 | 0 |
| 48 | 682.929 | 683.143 | 683.357 | 682.43265 | 684.5196 | 0 | 0 |
| 49 | 688.929 | 689.143 | 689.357 | 688.6935 | 690.78045 | 0 | 0 |
| 50 | 694.929 | 695.143 | 695.357 | 694.95435 | 697.0413 | 1 | 0 |
| 51 | 700.929 | 701.143 | 701.357 | 699.12825 | 701.2152 | 0 | 1 |
| 52 | 706.929 | 707.143 | 707.357 | 705.3891 | 707.47605 | 0 | 0 |
| 53 | 712.929 | 713.143 | 713.357 | 711.64995 | 713.7369 | 0 | 0 |
| 54 | 718.929 | 719.143 | 719.357 | 717.9108 | 719.99775 | 0 | 0 |
| 55 | 724.929 | 725.143 | 725.357 | 724.17165 | 726.2586 | 0 | 0 |
| 56 | 730.929 | 731.143 | 731.357 | 730.4325 | 732.51945 | 0 | 0 |
| 57 | 736.929 | 737.143 | 737.357 | 736.69335 | 738.7803 | 0 | 0 |
| 58 | 742.929 | 743.143 | 743.357 | 742.9542 | 745.04115 | 1 | 0 |
| 59 | 748.929 | 749.143 | 749.357 | 747.1281 | 749.21505 | 0 | 1 |
| 60 | 754.929 | 755.143 | 755.357 | 753.38895 | 755.4759 | 0 | 0 |
| 61 | 760.929 | 761.143 | 761.357 | 759.6498 | 761.73675 | 0 | 0 |
| 62 | 766.929 | 767.143 | 767.357 | 765.91065 | 767.9976 | 0 | 0 |

Fig.6

| ch | ONE-SEGMENT BAND FREQUENCY | | | INTERNAL CLOCK SIGNAL 2.4 | | OUT AT MIN. FREQ. | OUT AT MAX. FREQ. |
| --- | --- | --- | --- | --- | --- | --- | --- |
| | MIN. FREQ. | CENTER FREQ. | MAX. FREQ. | | | | |
| 13 | 472.929 | 473.143 | 473.357 | 472.8 | 475.2 | 0 | 0 |
| 14 | 478.929 | 479.143 | 479.357 | 477.6 | 480 | 0 | 0 |
| 15 | 484.929 | 485.143 | 485.357 | 484.8 | 487.2 | 0 | 0 |
| 16 | 490.929 | 491.143 | 491.357 | 489.6 | 492 | 0 | 0 |
| 17 | 496.929 | 497.143 | 497.357 | 496.8 | 499.2 | 0 | 0 |
| 18 | 502.929 | 503.143 | 503.357 | 501.6 | 504 | 0 | 0 |
| 19 | 508.929 | 509.143 | 509.357 | 508.8 | 511.2 | 0 | 0 |
| 20 | 514.929 | 515.143 | 515.357 | 513.6 | 516 | 0 | 0 |
| 21 | 520.929 | 521.143 | 521.357 | 520.8 | 523.2 | 0 | 0 |
| 22 | 526.929 | 527.143 | 527.357 | 525.6 | 528 | 0 | 0 |
| 23 | 532.929 | 533.143 | 533.357 | 532.8 | 535.2 | 0 | 0 |
| 24 | 538.929 | 539.143 | 539.357 | 537.6 | 540 | 0 | 0 |
| 25 | 544.929 | 545.143 | 545.357 | 544.8 | 547.2 | 0 | 0 |
| 26 | 550.929 | 551.143 | 551.357 | 549.6 | 552 | 0 | 0 |
| 27 | 556.929 | 557.143 | 557.357 | 556.8 | 559.2 | 0 | 0 |
| 28 | 562.929 | 563.143 | 563.357 | 561.6 | 564 | 0 | 0 |
| 29 | 568.929 | 569.143 | 569.357 | 568.8 | 571.2 | 0 | 0 |
| 30 | 574.929 | 575.143 | 575.357 | 573.6 | 576 | 0 | 0 |
| 31 | 580.929 | 581.143 | 581.357 | 580.8 | 583.2 | 0 | 0 |
| 32 | 586.929 | 587.143 | 587.357 | 585.6 | 588 | 0 | 0 |
| 33 | 592.929 | 593.143 | 593.357 | 592.8 | 595.2 | 0 | 0 |
| 34 | 598.929 | 599.143 | 599.357 | 597.6 | 600 | 0 | 0 |
| 35 | 604.929 | 605.143 | 605.357 | 604.8 | 607.2 | 0 | 0 |
| 36 | 610.929 | 611.143 | 611.357 | 609.6 | 612 | 0 | 0 |
| 37 | 616.929 | 617.143 | 617.357 | 616.8 | 619.2 | 0 | 0 |
| 38 | 622.929 | 623.143 | 623.357 | 621.6 | 624 | 0 | 0 |
| 39 | 628.929 | 629.143 | 629.357 | 628.8 | 631.2 | 0 | 0 |
| 40 | 634.929 | 635.143 | 635.357 | 633.6 | 636 | 0 | 0 |
| 41 | 640.929 | 641.143 | 641.357 | 640.8 | 643.2 | 0 | 0 |
| 42 | 646.929 | 647.143 | 647.357 | 645.6 | 648 | 0 | 0 |
| 43 | 652.929 | 653.143 | 653.357 | 652.8 | 655.2 | 0 | 0 |
| 44 | 658.929 | 659.143 | 659.357 | 657.6 | 660 | 0 | 0 |
| 45 | 664.929 | 665.143 | 665.357 | 664.8 | 667.2 | 0 | 0 |
| 46 | 670.929 | 671.143 | 671.357 | 669.6 | 672 | 0 | 0 |
| 47 | 676.929 | 677.143 | 677.357 | 676.8 | 679.2 | 0 | 0 |
| 48 | 682.929 | 683.143 | 683.357 | 681.6 | 684 | 0 | 0 |
| 49 | 688.929 | 689.143 | 689.357 | 688.8 | 691.2 | 0 | 0 |
| 50 | 694.929 | 695.143 | 695.357 | 693.6 | 696 | 0 | 0 |
| 51 | 700.929 | 701.143 | 701.357 | 700.8 | 703.2 | 0 | 0 |
| 52 | 706.929 | 707.143 | 707.357 | 705.6 | 708 | 0 | 0 |
| 53 | 712.929 | 713.143 | 713.357 | 712.8 | 715.2 | 0 | 0 |
| 54 | 718.929 | 719.143 | 719.357 | 717.6 | 720 | 0 | 0 |
| 55 | 724.929 | 725.143 | 725.357 | 724.8 | 727.2 | 0 | 0 |
| 56 | 730.929 | 731.143 | 731.357 | 729.6 | 732 | 0 | 0 |
| 57 | 736.929 | 737.143 | 737.357 | 736.8 | 739.2 | 0 | 0 |
| 58 | 742.929 | 743.143 | 743.357 | 741.6 | 744 | 0 | 0 |
| 59 | 748.929 | 749.143 | 749.357 | 748.8 | 751.2 | 0 | 0 |
| 60 | 754.929 | 755.143 | 755.357 | 753.6 | 756 | 0 | 0 |
| 61 | 760.929 | 761.143 | 761.357 | 760.8 | 763.2 | 0 | 0 |
| 62 | 766.929 | 767.143 | 767.357 | 765.6 | 768 | 0 | 0 |

Fig.7

| REFERENCE CLOCK FREQUENCY [MHz] | PLL OUTPUT FREQUENCY [MHz] | DIVIDING RATIO | SAMPLING CLOCK FREQUENCY OF A/D CONVERTER CIRCUIT [MHz] | OPERATIONAL CLOCK FREQUENCY [MHz] OF DEMODULATION PROCESSING CIRCUIT | OPERATIONAL CLOCK FREQUENCY [MHz] OF ERROR CORRECTION CIRCUIT |
|---|---|---|---|---|---|
| 16 | 192 | 92 | 192/92=2.08695... | ↓ | ↓ |
|  |  | 80 | 192/80=2.4 | ↓ | ↓ |

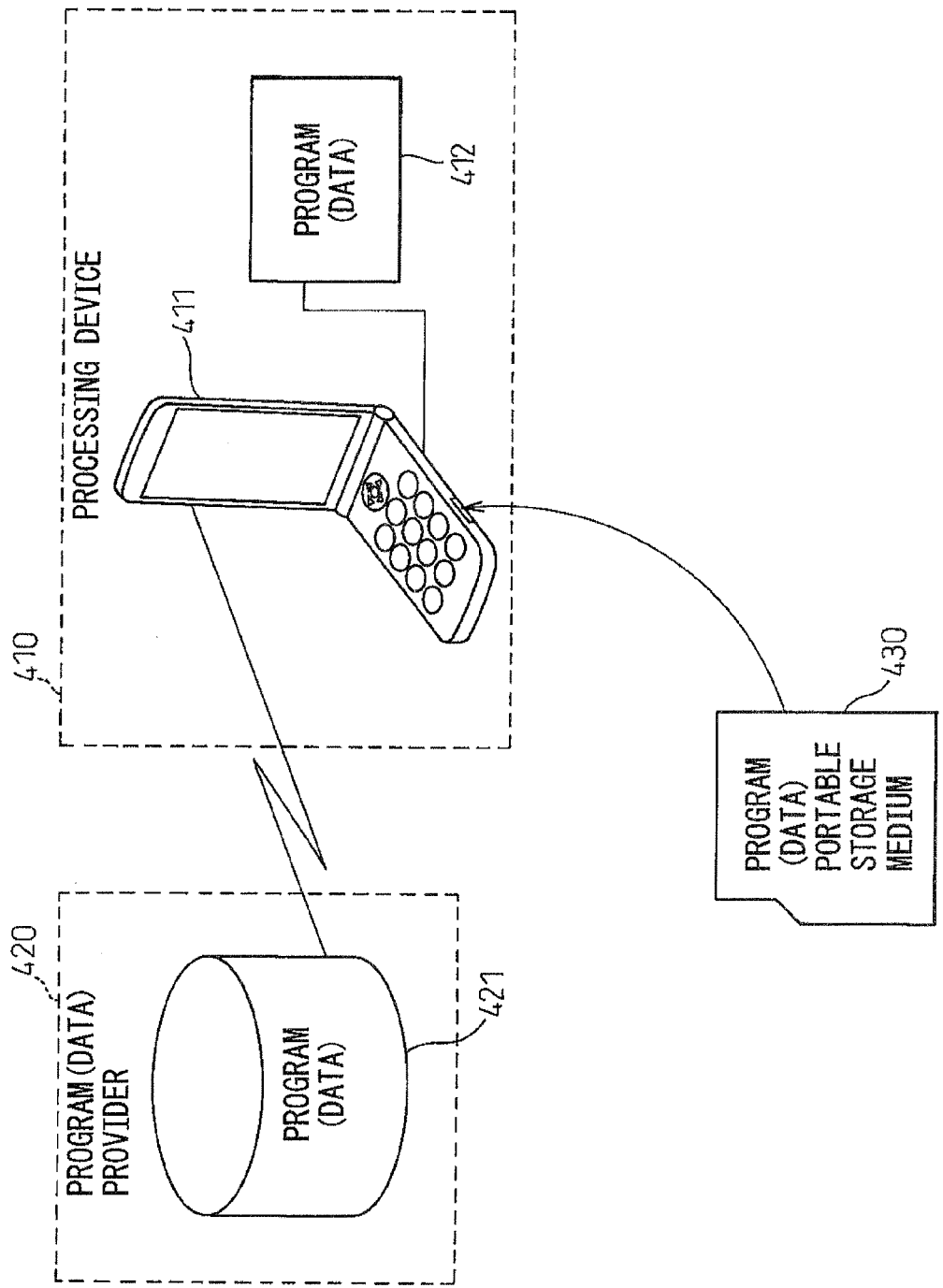

DIGITAL BROADCAST DEMODULATOR AND DIGITAL BROADCAST DEMODULATION METHOD FOR SUPPRESSING DEGRADATION OF RECEPTION CHARACTERISTICS

CROSS REFERENCE TO RELATED APPLICATION

This application is based upon and claims the benefit of priority from the prior Japanese Patent Application No. 2007-169366, filed on Jun. 27, 2007, the entire contents of which are incorporated herein by reference.

BACKGROUND

The embodiments relate to a digital broadcast demodulator and a digital broadcast demodulation method and, more particularly, to a digital broadcast demodulator and a digital broadcast demodulation method thereof which performs a predetermined demodulation by receiving an output signal from a tuner and using an internal clock signal which is synchronized with a reference signal.

In recent years, digital terrestrial broadcasting for mobile terminals (one-segment broadcasting) has started, and hence, one-segment broadcast receivers have been provided, for example, for portable terminals such as mobile phones and PDAs which have a one-segment broadcast receiver function, or for plugging into a USB terminal of a computer.

However, in the prior art, a device that digitizes and detects a received signal is disclosed, in which a first and second of two radio frequency signals are digitalized at a first and second clock rate, respectively, so as to generate first and second digital signals, performs signal quality measurements of the first and second digital signals, selecting one of the first and second digital signals based on the measured quality of the first and second digital signals, so that by operating an analog/digital converter via the selected one digital signal, reduction in sensitivity and precision of a broadband receiver can be avoided.

Furthermore, in the prior art, a receiver is disclosed in which data corresponding to the frequency error of a plurality of antenna downconverters is obtained from a operational result of a synchronization acquisition circuit or an AFC (Automatic Frequency Control) circuit and this data is stored in a memory, so that every time an antenna is switched, the frequency error data of that antenna is read out and converted into a voltage, and is input into a voltage-control oscillator in order to achieve a proper reception in a short period of time.

The prior art and the various problems thereof will be detailed later with reference to the attached drawings.

SUMMARY OF THE EMBODIMENTS

A first aspect provides a digital broadcast demodulator, which receives a tuner signal output from a tuner and carries out demodulation processing on the tuner signal by using an internal clock signal that is synchronized with a reference signal. The digital broadcast demodulator has an internal clock-signal generator and an internal clock frequency controller.

The internal clock-signal generator generates the internal clock signal, and the internal clock frequency controller controls a frequency of the internal clock signal in accordance with a reception channel.

A second aspect provides a digital broadcast demodulation method, in which a signal is received from a tuner and demodulation processing. The digital broadcast demodulation method is carried out on the signal using an internal clock signal which is synchronized with a reference signal.

The digital broadcast demodulation method has receiving data on a reception channel, and selecting and generating an internal clock signal from at least two internal clock signals having different frequencies. The selected and generated internal clock signal has a first frequency.

BRIEF DESCRIPTION OF THE DRAWINGS

The features and advantages of embodiments will be more clearly understood from the following description with reference to the accompanying drawings, wherein:

FIG. 5 shows a first example of a specific relationship between a frequency band used in one-segment broadcasting and a clock signal used in an embodiment of the digital broadcast demodulator;

FIG. 6 shows a second example of a specific relationship between a frequency band used in one-segment broadcasting and a clock signal used in an embodiment of the digital broadcast demodulator;

FIG. 7 is an explanatory diagram of an operation of a clock division circuit in an embodiment of the digital broadcast demodulator;

FIG. 9 is an explanatory drawing showing an embodiment of a digital broadcast demodulation program, and an example of a medium in which the digital broadcast demodulation program is stored.

DETAILED DESCRIPTION OF THE EMBODIMENTS

Before describing the embodiments in detail, examples of a prior art digital broadcast demodulator and some problems thereof will be described with reference to FIGS. 1 and 2.

Figure 1:
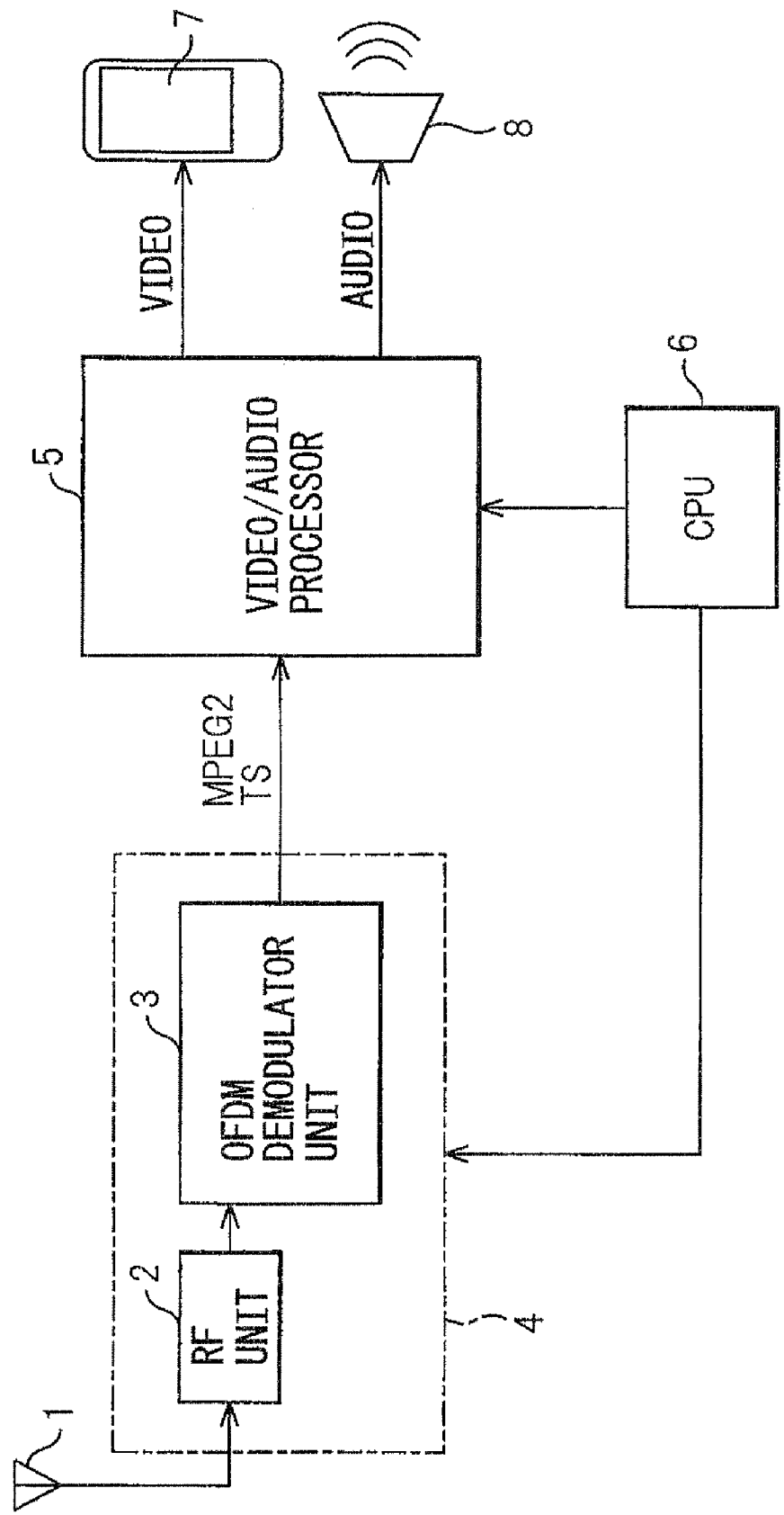
FIG. 1 is a block diagram conceptually illustrating an example of an entire arrangement of a digital broadcast receiver, to which a digital broadcast demodulator is applied.

FIG. 1 is a block diagram conceptually illustrating an example of an entire arrangement of a digital broadcast receiver, in a digital broadcast demodulator is provided, which shows an example of a mobile phone having a one-segment broadcast reception function.

In FIG. 1, reference numeral 1 denotes an antenna, 2 denotes a RF unit (tuner), 3 denotes a digital broadcast demodulator (OFDM (Orthogonal Frequency Division Multiplexing) demodulator unit), 4 denotes a digital broadcast reception module (one-segment broadcast reception module), 5 denotes a video/audio processor, 6 denotes a CPU, 7 denotes a display, and 8 denotes a speaker.

As shown in FIG. 1, for example, a one-segment broadcast receiver is provided with the antenna 1, the one-segment broadcast reception module (RF front end) 4 which receives signals (UHF signals) of each channel via the antenna 1, the video/audio processor (RF back-end) 5 which processes the digital signals received from the one-segment broadcast reception module 4, the CPU 6, the display 7 which displays the video received via a video signal from the one-segment broadcast reception module 4, and the speaker 8 which outputs audio received via an audio signal from the one-segment broadcast reception module 4.

The one-segment broadcast reception module 4 is provided with the RF unit 2, which first converts the reception channel signal into an intermediate frequency signal (IF signal), and the digital broadcast demodulator 3, which thereafter reproduces a digital signal (MPEG2-TS: Transport Stream) from this IF signal.

Thereafter, the MPEG-TS signal from the digital broadcast demodulator 3 is processed in the video/audio processor 5, and the processed video is displayed in the display 7 while the processed audio is output from the speaker 8. The one-segment broadcast reception module 4 and the video/audio processor 5 is controlled in accordance with the control of the CPU 6 provided in, e.g., a body of a mobile phone, etc.

Note that the digital broadcast receiver is not limited to a receiver for receiving a one-segment broadcasting signal, and the digital broadcast receiver is not limited to being installed in a mobile phone.

Figure 2:
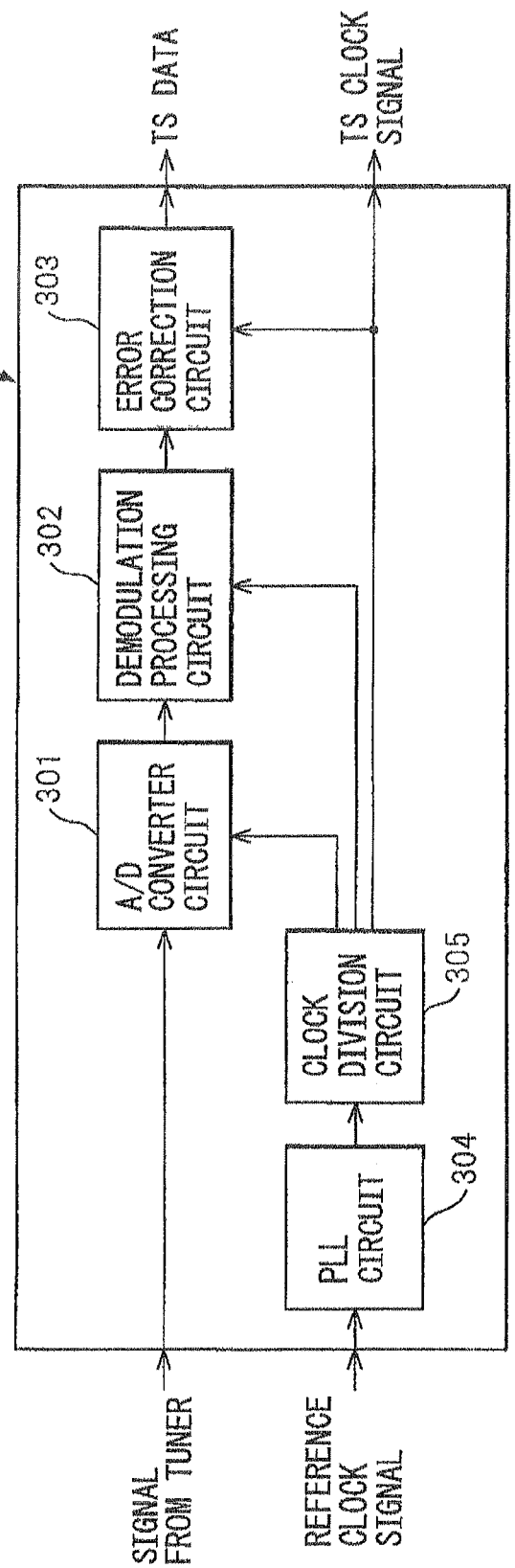
FIG. 2 is a block diagram illustrating an example of a prior-art digital broadcast demodulator.

FIG. 2 is a block diagram illustrating an example of a prior-art digital broadcast demodulator.

As shown in FIG. 2, a prior-art digital broadcast demodulator (OFDM demodulator unit) 300 receives signals from the RF unit (tuner) 2 and a reference clock signal, and outputs TS data and a TS clock signal, and is provided with an A/D converter circuit 301, a demodulation processing circuit 302, an error correction circuit 303, a PLL (Phase-Locked Loop) circuit 304, and a clock division circuit 305.

The A/D converter circuit 301 receives a signal (IF signal) from the RF unit 2 and performs analog/digital conversion in accordance with the clock signal (internal clock signal) output from the clock division circuit 305. Thereafter the demodulation processing circuit 302 carries out demodulation processing on the signal output from the A/D converter circuit 301 in accordance with the clock signal output from the clock division circuit 305, and the error correction circuit 303 carries out error correction on the signal output from the demodulation processing circuit 302 in accordance with the clock signal output from the clock division circuit 305, and the error correction circuit 303 outputs TS data.

The PLL circuit 304 receives the reference clock signal and outputs a signal in synchronization with the reference clock signal to the clock division circuit 305. Thereafter, the clock division circuit 305 frequency-divides the output signal from the PLL circuit 304 and supplies a predetermined frequency-divided clock signal to the A/D converter circuit 301, the demodulation processing circuit 302 and the error correction circuit 303, respectively, while outputting a TS clock signal to the above mentioned video/audio processor 5.

The demodulation processing circuit 302 carries out demodulation processing on the signal output from the A/D converter circuit 301 in accordance with the clock signal output from the clock division circuit 305, and outputs an MPEG2-TS signal via the error correction circuit 303.

In the prior art, for example, in a miniature one-segment broadcast reception module for a portable terminal as described above, harmonics of the TS output frequency emerge in the RF stage of the tuner as a spurious signal, which degrades the reception characteristics of the demodulator (e.g., a degradation of approximately 5 dB).

Furthermore, it is also conceivable, for example, to increase the clock frequency of the demodulation processing circuit 302 to thereby widen the harmonic interval so as to avoid the occurrence of a spurious signal in a desired band frequency; however, in such a case, the power consumption of the demodulation processing circuit 302 becomes large (e.g., an increase by approximately 17%) upon an increase in the clock frequency.

An object of the embodiments is to provide a digital broadcast demodulator and a digital broadcast demodulation method which can suppress degradation of the reception characteristics caused by a spurious signal. Furthermore, another object of the embodiments is to provide a digital broadcast demodulator and a digital broadcast demodulation method which can suppress an increase in power consumption.

Below, embodiments of a digital broadcast demodulator and a digital broadcast demodulation method will be described in detail with reference to the accompanying drawings.

Figure 3:
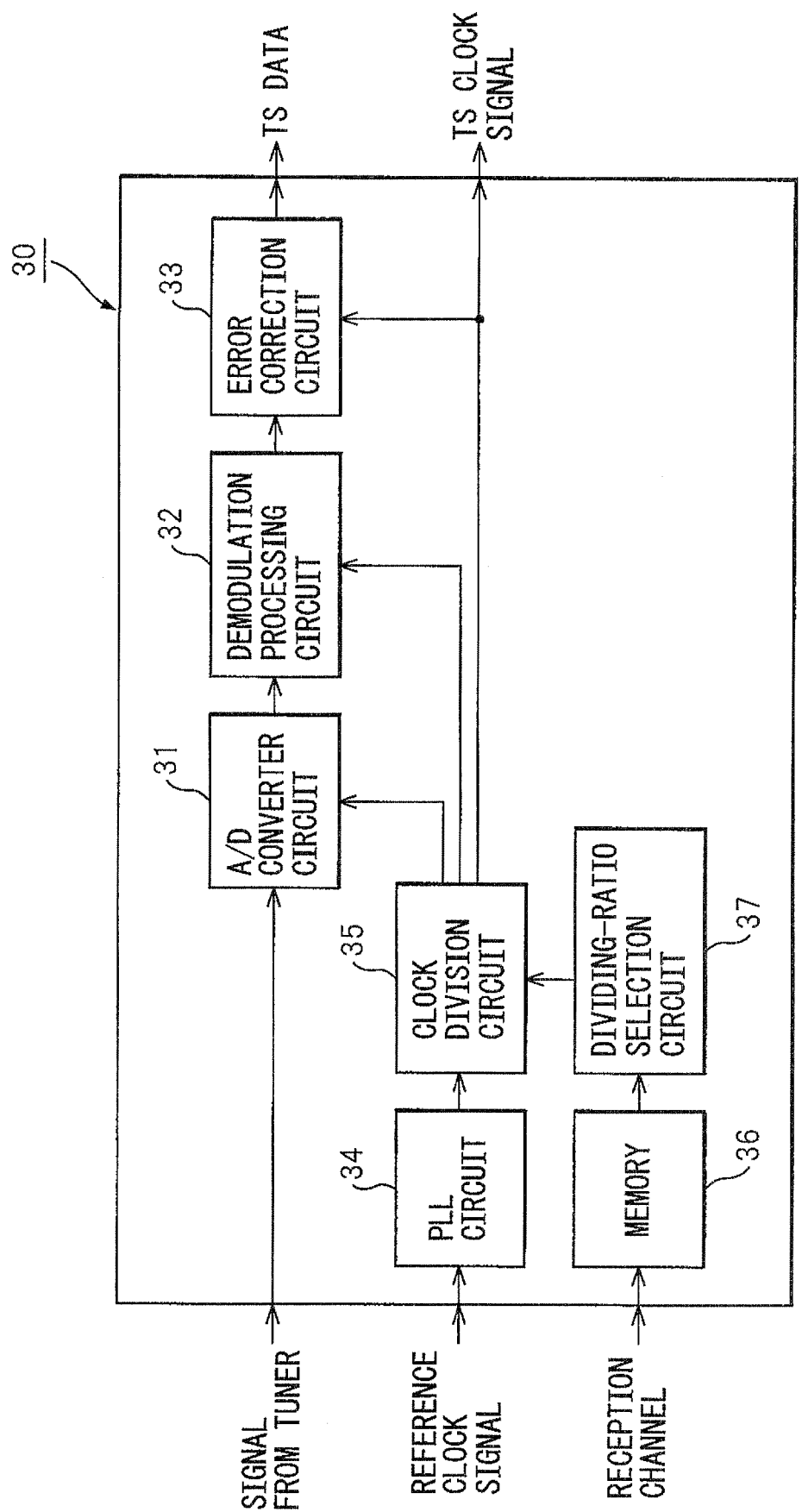
FIG. 3 is a block diagram illustrating an embodiment of the digital broadcast demodulator.

FIG. 3 is a block diagram illustrating the embodiment of the digital broadcast demodulator.

As shown in FIG. 3, a digital broadcast demodulator (OFDM demodulator unit) 30 receives a signal from the RF unit (tuner) 2 and a reference clock signal, and outputs TS data and a TS clock signal. Similar to the digital broadcast demodulator 300 shown in FIG. 2, the digital broadcast demodulator 30 is provided with an A/D converter circuit 31, a demodulation processing circuit 32, an error correction circuit 33, a PLL circuit 34, and a clock division circuit 35. In addition, the digital broadcast demodulator 30 is provided with a memory 36 and a dividing-ratio selection circuit 37.

The A/D converter circuit 31 receives signals (IF signals) from the RF unit 2, performs analog/digital conversion in accordance with the clock signal output from the clock division circuit 35, thereafter the demodulation processing circuit 32 carries out demodulation processing on the signal output from the A/D converter circuit 31 in accordance with the clock signal output from the clock division circuit 35, and the error correction circuit 33 carries out error correction on the signal output from the demodulation processing circuit 32 in accordance with the clock signal output from the clock division circuit 35 and outputs TS data.

The PLL circuit 34 receives a reference clock signal and outputs a signal in synchronization with the reference clock signal to the clock division circuit 35. Thereafter, the clock division circuit 35 frequency-divides the output signal from the PLL circuit 34 and supplies a predetermined frequency-divided clock signal to the A/D converter circuit 31, the demodulation processing circuit 32 and the error correction circuit 33, respectively, while outputting a TS clock signal to the above mentioned video/audio processor 5.

The demodulation processing circuit 32 carries out demodulation processing on the signal output from the A/D converter circuit 31 in accordance with the clock signal output from the clock division circuit 35, and outputs an MPEG2-TS signal via the error correction circuit 33.

The dividing-ratio selection circuit 37 controls the frequency ratio of the clock division circuit 35 in accordance with the reception channel by using data pre-stored in the memory 36 in order to prevent, e.g., harmonics of the TS output frequency emerging in the RF unit (RF stage of the tuner) 2 as a spurious signal.

Note that the data that is pre-stored in the memory 36 is data on the channels at which spurious signals are generated via a clock signal of, e.g., 2.08695 MHz (a first frequency of a first internal clock signal) and data on combinations of these channels and a 2.4 MHz clock signal (a second frequency of a second internal clock signal) which does not generate a spurious signal.

Accordingly, the clock signal which is output to the A/D converter circuit 31, the demodulation processing circuit 32 and the error correction circuit 33, is controlled so as to have a frequency wherein the harmonics of the clock signal do not emerge in the RF unit 2 as a spurious signal.

Figure 4:
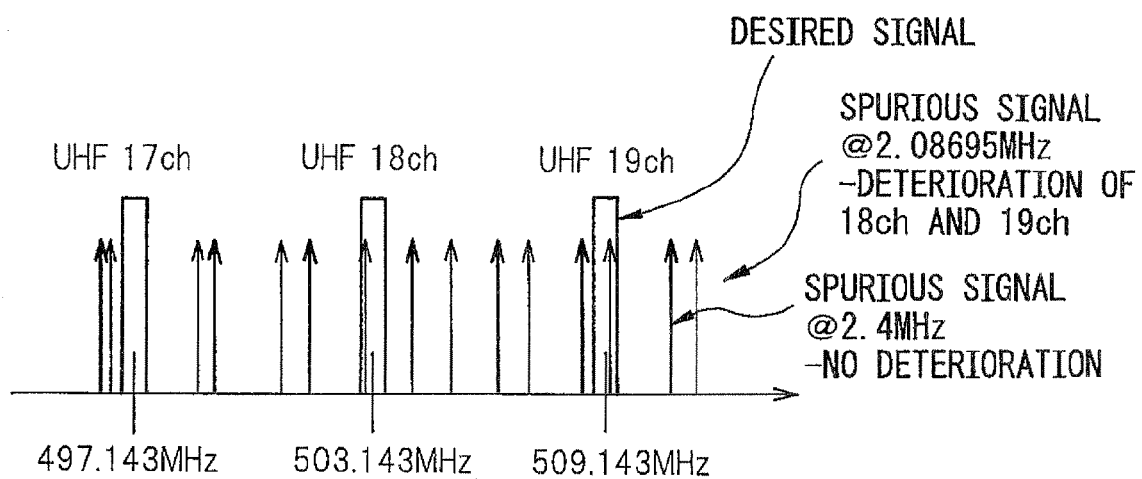
FIG. 4 is a conceptual diagram, showing an example of digital broadcasting, illustrating the relationship between a digital terrestrial broadcast frequency-band for a mobile terminal (one-segment broadcasting) and a clock signal used in an embodiment of the digital broadcast demodulator.

FIG. 4 is a conceptual diagram, showing an example of digital broadcasting, illustrating the relationship between a digital terrestrial broadcast (one-segment broadcasting) frequency-band for a mobile terminal and the clock signal used in an embodiment of the digital broadcast demodulator.

As shown in FIG. 4, the UHF broadcasting (one-segment broadcasting) channel 17 has a center frequency of 497.143 MHz and a band frequency of 428 KHz, the UHF broadcasting channel 18 has a center frequency of 503.143 MHz and a band frequency of 428 KHz, and the UHF broadcasting channel 19 has a center frequency of 509.143 MHz and a band frequency of 428 KHz.

In the digital broadcast demodulator 30 of the illustrated embodiment, in the case where, for example, channel 17 is selected and received, the 2.08695 MHz clock signal (a first frequency of the first internal clock signal) is used. Alternatively, in the case where channel 18 or channel 19 is selected and received, the 2.4 MHz clock signal (a second frequency of the second internal clock signal) is used.

In other words, in the case of a clock signal which has a low frequency of 2.08695 MHz that does not generate spurious signal at a reception channel (e.g., in the case of channel 17), an increase in power consumption of the digital broadcast demodulator 30 is prevented by the use of the 2.08695 MHz clock signal, and in the case where the 2.08695 MHz clock signal generates a spurious signal at a reception channel (e.g., in the case of channels 18 and 19), the 2.4 MHz clock signal is used, which although has a higher frequency than the 2.08695 MHz clock signal, does not generate a spurious signal at any channel.

Note that in the case where, for example, channel 18 is the reception channel, the 2.4 MHz clock signal will be used, which of course means that the power consumption of the digital broadcast demodulator 30 will be larger than when the 2.08695 MHz clock signal is used.

Hence, according to the illustrated embodiment, in the case where the first internal clock signal that has a low frequency (2.08695 MHz clock signal) does not generate a spurious signal at the reception channel, the first internal clock signal is used, and if the first internal clock signal generates a spurious signal with the reception channel, the second internal clock signal (2.4 MHz clock signal) is used which has a higher frequency and does not generate a spurious signal at any channel. Accordingly, degradation of reception characteristics due to a spurious signal can be suppressed, and an increase in power consumption can be also be suppressed.

Note that it is possible for the second internal clock signal to be a clock signal having a frequency which does not generate a spurious signal with respect to the reception channel at which a spurious signal occurs with the first internal clock signal, rather than a clock signal which has a frequency (i.e., 2.4 MHz clock signal) that does not generate a spurious signal at any channel. Furthermore, the second internal clock signal can be provided as a plurality of clock signals having different frequencies with respect to the first internal clock signal.

FIGS. 5 and 6 show specific examples of the relationship between a frequency band used in one-segment broadcasting and a clock signal used in the illustrated embodiment of the digital broadcast demodulator. FIG. 5 shows the relationship between the one-segment band frequency of UHF channels 13 through 62 and the 2.08695 MHz internal clock signal (first internal clock signal). FIG. 6 shows the relationship between the one-segment band frequency of UHF channels 13 through 62 and the 2.4 MHz internal clock signal (second internal clock signal).

As shown in FIG. 5, since harmonics of the 2.08695 MHz first internal clock signal are included in predetermined channels of the one-segment band frequency, spurious signals are generated at the RF stage of the tuner (2) at the predetermined channels, which causes degradation in the reception characteristics.

Specifically, for example, since harmonics 241 times the frequency of first internal clock signal (2.08695 MHz×241=502.95495 MHz) coincide with the minimum frequency proximity of channel 18 having a one-segment band frequency of 502.929 MHz through 503.357 MHz, a spurious signal is generated, and since harmonics 244 times the frequency of the first internal clock signal (2.08695 MHz×244=509.2158 MHz) coincide with the maximum frequency proximity of channel 19 having a one-segment band frequency of 508.929 MHz through 509.357 MHz, a spurious signal is also generated. Note that at the "OUT at Min. Freq." and the "OUT at Max. Freq." columns in FIG. 5, "1" indicates a channel (at either the minimum frequency side or the maximum frequency side of each one-segment band frequency) at which a spurious signal occurs via the 2.08695 MHz first internal clock signal.

On the other hand, as shown in FIG. 6, since harmonics of the 2.4 MHz second internal clock signal do not coincide with any the channels 13 through 62 of the one-segment band frequency, spurious signals are not generated.

In the illustrated embodiment, in regard to the 2.08695 MHz first internal clock signal which has a low frequency so that the power consumption can be kept low, the first internal clock signal is used for the channels at which spurious signals are not generated (specifically, channels 13 through 17, 20 through 25, 28 through 33, 36 through 41, 44 through 49, 52 through 57, and 60 through 62), and in regard to the channels at which spurious signals are generated by the first internal clock signal (specifically, channels 18, 19, 26, 27, 34, 35, 42, 43, 50, 51, 58 and 59), the 2.4 MHz second internal clock signal which does not generate spurious signals at these channels is used.

Hence, according to the illustrated embodiment, in the case where the first internal clock signal (2.08695 MHz clock signal) having a low frequency does not generate a spurious signal with the reception channel, the first internal clock signal is used, whereas if the first internal clock signal generates a spurious signal with the reception channel, the second internal clock signal (2.4 MHz clock signal) is used which has a high frequency and does not generate a spurious signal with any of the channels. Therefore, degradation of reception characteristics due to a spurious signal can be suppressed, and an increase in power consumption (i.e., the power consumption of the demodulator) can be also be suppressed.

FIG. 7 is an explanatory diagram of an operation of a clock division circuit of the illustrated embodiment of the digital broadcast demodulator.

As can be understood by FIG. 7, the clock division circuit 35 receives a 192 MHz signal from the PLL circuit 34, into which a 16 MHz reference clock signal is input, and when, e.g., channel 17 is received in accordance with a control signal from the dividing-ratio selection circuit 37, a $\frac{1}{80}^{th}$ clock cycle of the 2.08695 MHz clock signal is output, and when channel 18 or 19 is received, a $\frac{1}{92}^{nd}$ clock cycle of the 2.4 MHz clock signal is output, so that no spurious signals are generated at the RF unit 2 caused by harmonics from the clock signals output from the clock division circuit 35.

Note that in FIG. 7, the sampling frequency of the A/D converter circuit 31, the operational clock frequency of the demodulation processing circuit 32, and the operational clock frequency of the error correction circuit 33 are all the same. However, a modified embodiment is possible in which, for example, the clock signal (operational clock signal) frequency supplied to the error correction circuit 33 is double that of the clock (sampling) frequency supplied to the A/D converter circuit 31.

Figure 8:
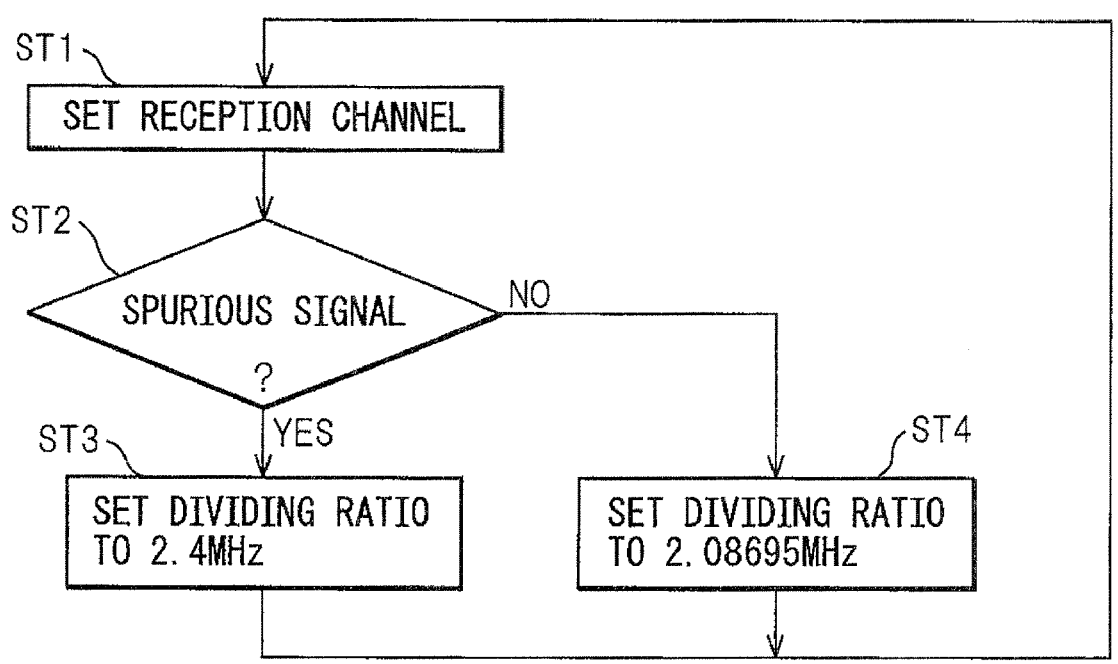
FIG. 8 is a flow chart illustrating an example of a process of a digital broadcast demodulation method.

FIG. 8 is a flow chart illustrating an example of a process of a digital broadcast demodulation method, which describes the selection process of the internal clock signal to be used by the digital broadcast demodulator (OFDM demodulator unit) 30. Note that in an initial state, for example, upon the power being turned ON, the clock division circuit 35 outputs the low-frequency 2.08695 MHz clock signal which has a lower power consumption.

Firstly, at step ST1, a reception channel is set upon commencement of reception, and control proceeds to step ST2. At step ST2 it is judged whether a spurious signal has occurred in the RF unit 2 due to harmonics in the internal clock signal.

If at step ST2 it is determined that a spurious signal caused by harmonics in the internal clock signal has occurred in the RF unit 2, control proceeds to step ST3 at which the dividing ratio is set to 92 ($1/92^{nd}$ of a cycle) so that the clock division circuit 35 outputs a 2.4 MHz internal clock signal.

On the other hand, if at step ST2 it is determined that a spurious signal caused by harmonics in the internal clock signal has not occurred in the RF unit 2, control proceeds to step 4 at which the dividing ratio is set to 80 ($1/80^{th}$ of a cycle) so that the clock division circuit 35 outputs a 2.08695 MHz internal clock signal. The above described processes are carried out repetitively.

Accordingly, in the case where the first internal clock signal having a low frequency (2.08695 MHz clock signal) does not generate spurious signal at the reception channel, the first internal clock signal is used, and if the first internal clock signal generates a spurious signal with the reception channel, the second internal clock signal (2.4 MHz clock signal) is used which has a higher frequency and does not generate a spurious signal at any channel. Accordingly, degradation of reception characteristics due to a spurious signal can be suppressed, and an increase in power consumption can be also be suppressed.

Hence, according to the embodiment of the digital broadcast demodulation method, firstly in the case of a channel which is affected by the incorporation of a spurious signal in the RF stage via an operation at the initial clock frequency (internal clock frequency) of 2.08695 MHz (in the case where the 2.08695 MHz clock signal (first internal clock signal) generates a spurious signal at the reception channel), the clock frequency is changed to 2.4 MHz (second internal clock signal), otherwise (in the case where the 2.08695 MHz clock signal (first internal clock signal) does not generate a spurious signal at the reception channel) the clock frequency is not changed.

Note that as mentioned above, data on combinations of whether or not spurious signals occur via the first and second internal clock signals with respect to each channel are pre-stored in the memory 36, and the dividing ratio is selected by the dividing-ratio selection circuit 37, in accordance with the data on whether or not spurious signals occur, so as to change the clock frequency.

Furthermore, the frequencies of the first and second clock signals are not limited to the above-described 2.08695 MHz and 2.4 MHz, and of course the dividing ratio of the clock division circuit 35 can be changed in accordance with the digital broadcast frequency band which is being applied and can be changed in accordance with the circuit design.

FIG. 9 is an explanatory drawing showing an embodiment of a digital broadcast demodulation program, and an example of a medium in which the digital broadcast demodulation program is stored. In FIG. 9, reference numeral 410 denotes a processing device, 420 denotes a program (data) provider, and 430 denotes a program (data) portable storage medium. Note that in FIG. 9 a mobile phone is shown as the processing device (computer) 410, however, the embodiment is not limited to a mobile phone, as mentioned above.

The embodiment is provided with a processing unit memory 412 for supplying a program (data) to, e.g., the processing device 410 as shown in FIG. 9, and the program (data) is performed by the processing device 410. The processing device 410 is provided with an arithmetic processing unit body 411 and the processing unit memory (e.g., a RAM (Random Access Memory)) 412 which supplies the program (data) to the arithmetic processing unit body 411 and/or stores a processed result. The program (data) provided in the processing device 410 is loaded onto a main memory of the processing device 410 is performed via the main memory thereof.

The program provider 420 includes a program storing device (online memory, e.g., DASD (Direct Access Memory)) 421 which provides programs to the processing device 410 via, e.g., an internet connection, etc. Alternatively, programs can be provided to the processing device 410 via various kinds of portable storage mediums 430 such as a Mini-SD or Micro-SD memory card, an interface, or an optical disk or a magnetic disk via a computer. The medium, onto which the digital broadcast demodulation program pertaining to the embodiment is stored, can of course include a variety of the above described processing unit memory 412, the online memory 421, and the portable storage medium 430.

As described above, according to the embodiment, a digital broadcast demodulator and a digital broadcast demodulation method can be achieved, in which degradation of reception characteristics caused by a spurious signal can be prevented.

The embodiments can be applied to a one-segment broadcast reception module for digital terrestrial broadcasting (one-segment broadcasting) for a mobile terminal to be used as a portable terminal such as, e.g., a mobile phone. Furthermore, the present embodiments can be applied to a one-segment broadcast reception module other than for a mobile terminal, and moreover, can be widely applied to a reception module demodulator other than for one-segment broadcasting.

What is claimed is:

1. A digital broadcast demodulator, which receives a tuner signal output from a tuner and carries out demodulation processing on said tuner signal by using an internal clock signal that is synchronized with a reference signal, comprising:
    an internal clock-signal generator to generate said internal clock signal;
    a clock division circuit to divide the internal clock signal from the internal clock-signal generator;
    an internal clock frequency controller controlling a frequency of said internal clock signal in accordance with a reception channel;
    a memory storing data on a channel at which a spurious signal is generated by a first internal clock signal of a first frequency, and data on a combination of said channel and a second internal clock signal of a second frequency which does not generate a spurious signal;
    a clock-signal switching controller configured to cause said internal clock generator to generate said first internal clock signal in the case where said first internal clock signal does not generate a spurious signal at said reception channel, and cause said internal clock generator to generate said second internal clock signal in the case where said first internal clock signal generates a spurious signal at said reception channel, in accordance with data output from said memory; and an OFDM demodulator unit of a one-segment broadcast reception module, wherein said OFDM demodulator unit includes an A/D converter circuit which receives IF signals from said tuner and performs analog/digital conversion, a demodulation processing circuit which carries out demodulation processing on a signal output from said A/D converter circuit, and an error correction circuit which carries out error correction on a signal output from said demodulation processing circuit and outputs a digital signal, and said internal clock-signal generator includes a Phase-Locked Loop (PLL) circuit which receives said reference signal and outputs said synchronized signal, and the clock division circuit which frequency-divides said synchronized signal and supplies one of said first internal clock signal and said second internal clock signal to said A/D converter circuit, said demodulation processing circuit and said error correction circuit, and wherein said internal clock frequency controller controls a dividing ratio of the clock division circuit in accordance with data output from said memory so that the clock division circuit outputs one of said first internal clock signal and said second internal clock signal based on the signal from the internal clock frequency controller.

2. The digital broadcast demodulator as claimed in claim 1, wherein said first frequency is lower than said second frequency; and said first internal clock signal having said first frequency is used in the case where said first internal clock signal does not generate a spurious signal at said reception channel.

3. The digital broadcast demodulator as claimed in claim 1, wherein said second frequency comprises a frequency that does not generate a spurious signal at two or more reception channels.

4. A digital broadcast demodulator, which receives a tuner signal output from a tuner and carries out demodulation processing on said tuner signal by using an internal clock signal that is synchronized with a reference signal, comprising:

an internal clock-signal generator generating said internal clock signal;

an internal clock signal;

an internal clock frequency controller controlling a frequency of said internal clock signal in accordance with a reception channel, wherein said internal clock frequency controller comprises a memory storing data on a channel at which a spurious signal is generated by a first internal clock signal of a first frequency, and data on a combination of said channel and a second internal clock signal of a second frequency which does not generate a spurious signal; and a clock-signal switching controller which causes said internal clock generator to generate said first internal clock signal in the case where said first internal clock signal does not generate a spurious signal at said reception channel, and causes said internal clock generator to generate said second internal signal in the case where said first internal clock signal generates a spurious signal at said reception channel, in accordance with data output from said memory, wherein said digital broadcast demodulator comprises an OFDM demodulator unit of a one-segment broadcast reception module, wherein said OFDM demodulator unit includes an A/D converter circuit which receives IF signals from said tuner and performs analog/digital conversion, a demodulation processing circuit which carries out demodulation, processing on a signal output from said A/D converter circuit, and an error correction circuit which carries out error correction on a signal output from said demodulation processing circuit and outputs a digital signal; and said internal clock-signal generator includes a PLL circuit which receives said reference signal and outputs said synchronized signal; and a clock division circuit which frequency-divides said synchronized signal and supplies one of said first internal clock signal and said second internal clock signal to said A/D converter, said demodulation processing circuit and said error correction circuit, wherein said internal clock frequency controller controls a dividing ratio of said clock division circuit in accordance with data output from said memory so as to select and generate one of said first internal clock signal and said second internal clock signal.

* * * * *